US011829298B2

(12) United States Patent
Hensley et al.

(10) Patent No.: US 11,829,298 B2
(45) Date of Patent: Nov. 28, 2023

(54) ON-DEMAND MEMORY ALLOCATION

(71) Applicant: Apple Inc., Cupertino, CA (US)

(72) Inventors: Justin A. Hensley, Mountain View, CA (US); Karl D. Mann, Geneva, FL (US); Yoong Chert Foo, London (GB); Terence M. Potter, Austin, TX (US); Frank W. Liljeros, Sanford, FL (US); Ralph C. Taylor, Deland, FL (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 16/804,128

(22) Filed: Feb. 28, 2020

(65) Prior Publication Data

US 2021/0271606 A1 Sep. 2, 2021

(51) Int. Cl.
*G06F 12/1018* (2016.01)
*G06F 12/084* (2016.01)
G06F 30/392 (2020.01)

(52) U.S. Cl.
CPC ........ *G06F 12/1018* (2013.01); *G06F 12/084* (2013.01); *G06F 30/392* (2020.01); *G06F 2212/622* (2013.01); *G06F 2212/651* (2013.01)

(58) Field of Classification Search
None
See application file for complete search history.

(56) References Cited

U.S. PATENT DOCUMENTS

| 5,873,120 A | 2/1999 | Harvey et al. |
| 9,448,930 B2 | 9/2016 | Asaro et al. |
| 2012/0236010 A1* | 9/2012 | Ginzburg ................ G06F 12/08 345/502 |

(Continued)

FOREIGN PATENT DOCUMENTS

EP 0919928 A2 6/1999

OTHER PUBLICATIONS

Bathen et al. "SPMVisor: Dynamic ScratchPad Memory Virtualization for Secure, Low Power, and High Performance Distributed On-Chip Memories." Oct. 2011. ACM. CODES+ISSS'11. pp. 79-88.*

(Continued)

*Primary Examiner* — Nathan Sadler
(74) *Attorney, Agent, or Firm* — Kowert, Hood, Munyon, Rankin & Goetzel, P.C.; Michael B. Davis; Dean M. Munyon

(57) ABSTRACT

Techniques are disclosed relating to dynamically allocating and mapping private memory for requesting circuitry. Disclosed circuitry may receive a private address and translate the private address to a virtual address (which an MMU may then translate to physical address to actually access a storage element). In some embodiments, private memory allocation circuitry is configured to generate page table information and map private memory pages for requests if the page table information is not already setup. In various embodiments, this may advantageously allow dynamic private memory allocation, e.g., to efficiently allocate memory for graphics shaders with different types of workloads. Disclosed caching techniques for page table information may improve performance relative to traditional techniques. Further, disclosed embodiments may facilitate memory consolidation across a device such as a graphics processor.

14 Claims, 8 Drawing Sheets

(56) References Cited

U.S. PATENT DOCUMENTS

| | | | | |
|---|---|---|---|---|
| 2014/0281356 | A1* | 9/2014 | Buschardt | G06F 12/10 |
| | | | | 711/206 |
| 2017/0045941 | A1 | 2/2017 | Tokubo et al. | |
| 2017/0075818 | A1* | 3/2017 | Liu | G06F 3/0652 |
| 2017/0123996 | A1 | 5/2017 | Kishan et al. | |
| 2017/0181079 | A1* | 6/2017 | Sauer | H04W 52/02 |
| 2017/0188154 | A1 | 6/2017 | Werris | |
| 2018/0081816 | A1* | 3/2018 | Coburn | G06F 12/0868 |
| 2018/0089794 | A1* | 3/2018 | Gopalakrishnan | G06F 21/62 |
| 2020/0065013 | A1* | 2/2020 | Griffith | G06F 3/0632 |
| 2020/0201758 | A1* | 6/2020 | Asaro | G06T 1/60 |

OTHER PUBLICATIONS

Tian et al. "A Full GPU Virtualization Solution with Mediated Pass-Through." Jun. 2014. USENIX. ATC '14. pp. 121-132.*

Xing et al. "Intel® Software Guard Extensions (Intel® SGX) Software Support for Dynamic Memory Allocation inside an Enclave." Jun. 2016. ACM. HASP 2016. pp. 1-9.*

International Preliminary Report on Patentability from PCT/US2018/052646, dated Mar. 31, 20120, pp. 1-9.

Nathan Brookwood, "NVIDIA Solves the GPU Computing Puzzle," An Insight 64 White Paper; Sponsored by NVIDIA; Sep. 2009, 9 pages.

International Search Report and Written Opinion in PCT Appl. No. PCT/US2021/019353 dated Jun. 17, 2021, 12 pages.

Appendix A "Hardware Description Languages" from Neil Weste, David Harris (2010) "CMOS VLSI Design: A Circuits and Systems Perspective" (4th Edition); http://pages.hmc.edu/harris/cmosvlsi/4e/cmosvlsidesign_4e_App.pdf; pp. 699-784. [Retrieved Oct. 14, 2021].

"Hardware description language"; Wikipedia; https://en.wikipedia.org/w/index.php?title=Hardware_description_language&oldid=1055897548; last edited on Nov. 18, 2021, 11 pages.

* cited by examiner

ON-DEMAND MEMORY ALLOCATION

BACKGROUND

Technical Field

This disclosure relates generally to computer memory management and more particularly to techniques for on-demand allocation of private memory.

Description of the Related Art

Processors such as graphics processing units (GPUs) may use various types of memory spaces. For example, shared memory spaces may be used to share data processed by multiple processor blocks while other blocks such as shader processors may also use private memory space(s) during operation.

Figure 1A:
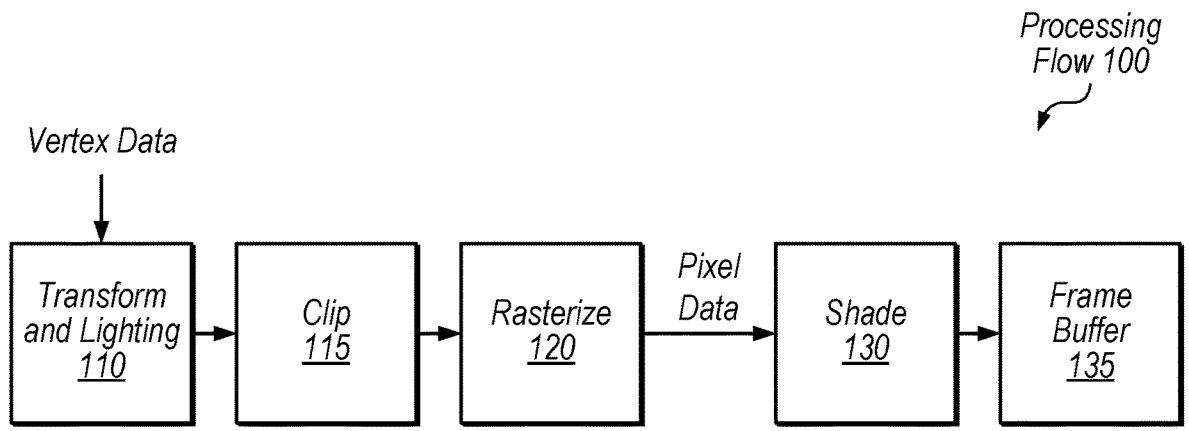
FIG. 1A is a diagram illustrating an overview of example graphics processing operations, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "programmable shader processor configured to execute a shader program" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

Graphics Processing Overview

Referring to FIG. 1A, a flow diagram illustrating an example processing flow 100 for processing graphics data is shown. In some embodiments, transform and lighting step 110 may involve processing lighting information for vertices received from an application based on defined light source locations, reflectance, etc., assembling the vertices into polygons (e.g., triangles), and/or transforming the polygons to the correct size and orientation based on position in a three-dimensional space. Clip step 115 may involve discarding polygons or vertices that fall outside of a viewable area. Rasterize step 120 may involve defining fragments within each polygon and assigning initial color values for each fragment, e.g., based on texture coordinates of the vertices of the polygon. Fragments may specify attributes for pixels which they overlap, but the actual pixel attributes may be determined based on combining multiple fragments (e.g., in a frame buffer) and/or ignoring one or more fragments (e.g., if they are covered by other objects). Shade step 130 may involve altering pixel components based on lighting, shadows, bump mapping, translucency, etc. Shaded pixels may be assembled in a frame buffer 135. Modern GPUs typically include programmable shaders that allow customization of shading and other processing steps by application developers. Thus, in various embodiments, the example elements of FIG. 1A may be performed in various orders, performed in parallel, or omitted. Additional processing steps may also be implemented.

Figure 1B:
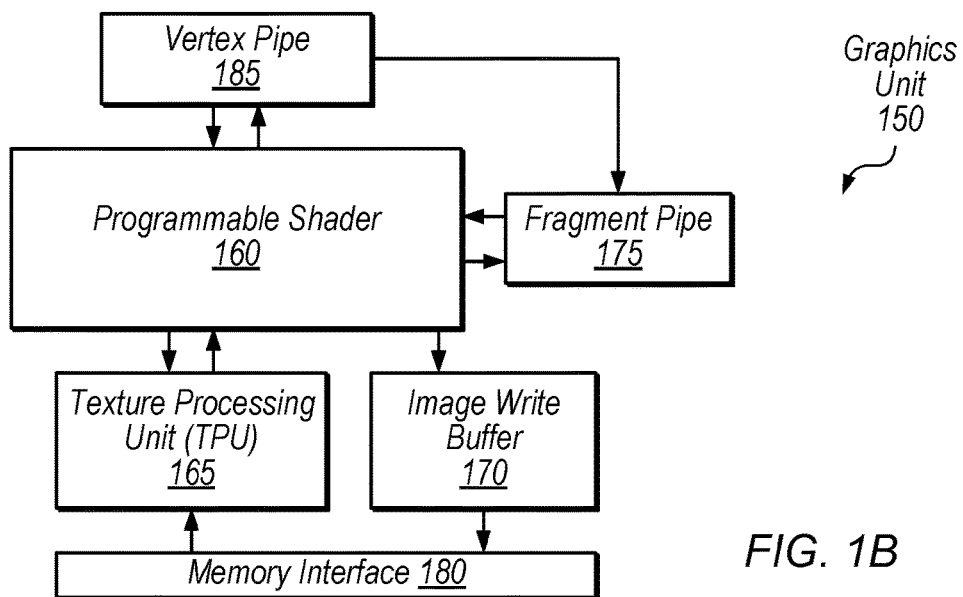
FIG. 1B is a block diagram illustrating an example graphics unit, according to some embodiments.

Referring now to FIG. 1B, a simplified block diagram illustrating a graphics unit 150 is shown, according to some embodiments. In the illustrated embodiment, graphics unit 150 includes programmable shader 160, vertex pipe 185, fragment pipe 175, texture processing unit (TPU) 165, image write unit 170, and memory interface 180. In some embodiments, graphics unit 150 is configured to process both vertex and fragment data using programmable shader 160, which may be configured to process graphics data in parallel using multiple execution pipelines or instances.

Vertex pipe 185, in the illustrated embodiment, may include various fixed-function hardware configured to process vertex data. Vertex pipe 185 may be configured to communicate with programmable shader 160 in order to coordinate vertex processing. In the illustrated embodiment, vertex pipe 185 is configured to send processed data to fragment pipe 175 and/or programmable shader 160 for further processing.

Fragment pipe 175, in the illustrated embodiment, may include various fixed-function hardware configured to process pixel data. Fragment pipe 175 may be configured to communicate with programmable shader 160 in order to coordinate fragment processing. Fragment pipe 175 may be configured to perform rasterization on polygons from vertex pipe 185 and/or programmable shader 160 to generate fragment data. Vertex pipe 185 and/or fragment pipe 175 may be coupled to memory interface 180 (coupling not shown) in order to access graphics data.

Programmable shader 160, in the illustrated embodiment, is configured to receive vertex data from vertex pipe 185 and fragment data from fragment pipe 175 and/or TPU 165. Programmable shader 160 may be configured to perform vertex processing tasks on vertex data which may include various transformations and/or adjustments of vertex data. Programmable shader 160, in the illustrated embodiment, is also configured to perform fragment processing tasks on pixel data such as texturing and shading, for example. Programmable shader 160 may include multiple execution pipelines for processing data in parallel.

TPU 165, in the illustrated embodiment, is configured to schedule fragment processing tasks from programmable shader 160. In some embodiments, TPU 165 is configured to pre-fetch texture data and assign initial colors to fragments for further processing by programmable shader 160 (e.g., via memory interface 180). TPU 165 may be configured to provide fragment components in normalized integer formats or floating-point formats, for example. In some embodiments, TPU 165 is configured to provide fragments in groups of four (a "fragment quad") in a 2×2 format to be processed by a group of four execution pipelines in programmable shader 160.

Image write unit (IWU) 170, in some embodiments, is configured to store processed tiles of an image and may perform operations to a rendered image before it is transferred for display or to memory for storage. In some embodiments, graphics unit 150 is configured to perform tile-based deferred rendering (TBDR). In tile-based rendering, different portions of the screen space (e.g., squares or rectangles of pixels) may be processed separately. Memory interface 180 may facilitate communications with one or more of various memory hierarchies in various embodiments.

Overview of On-Demand Memory Allocation

Graphics shader processors typically use a private memory space, e.g., to store data while executing a set of graphics work, before writing results (e.g., for a kick) to a shared memory space. Providing fixed private memory allocations for these processors may be inefficient in certain scenarios, e.g., when some execution paths for a program use a substantially larger memory footprint than others, when it is of value to migrate work from one part of a GPU to another (e.g., to move a background process to give resources to higher-priority work), and when programs have different types of memory needs for different portions (e.g., an application that needs a large thread-private allocation to start but later needs a smaller thread-private allocation paired with a threadgroup-private allocation). Further, fixed allocation may not allow sharing memory space between shader processors and other circuitry.

In disclosed embodiments discussed in detail below, the GPU dynamically allocates and maps private memory space. In some embodiments, a memory allocator circuit is configured to reserve and map pages of private memory space for circuits that use private memory. This may allow consolidation of multiple memory spaces into a shared global memory space, in some embodiments. In some embodiments, the memory allocator supports the following operations: reserve, translate-map, translate-no-map, unmap, and release.

The reserve command reserves one or more private pages (which may include any pages to be used for a page table) from a virtual page pool. This command may not actually map any pages, but may cause a counter of available virtual pages to be decremented. Reserving pages prior to actually mapping the pages may avoid deadlock when multiple circuits need pages mapped, in some embodiments.

The translate-map command translates a private memory address to a virtual address, including mapping a virtual page from the page pool into the page table if needed. Note that this command may provide a mapping even if the corresponding page table has not been setup, e.g., by generating all or a portion of the page table (which may be hierarchical). Thus, at the beginning of a set of graphics work, the page table for its private memory space may not exist. The translate-map command may set mask information in the page table hierarchy that indicates the validity of lower-level entries, which may be used to track allocated pages and allow tear-down of a page table hierarchy after pages are unmapped.

The translate-no-map command translates a provided private address to a virtual address and returns an indication of whether a corresponding sector has been modified. If the sector has not been modified, a requested read from the provided address is not performed. If a virtual page has not been mapped for the private page corresponding to the request, the translate-no-map command will not result in a page being mapped.

The unmap command may clear modified field(s) corresponding to a provided private address. Once all modified fields have been cleared, a corresponding virtual data page may be released back to a page pool. The release command frees a mapped page and releases the page back to a virtual page pool, in some embodiments.

In some embodiments, a device implements multiple private memory spaces with various scopes, which may be consolidated within a backing global memory space.

Accesses within each private space may be translated to virtual addresses in the global memory space. For example, a private memory space for general purpose and stack registers may have SIMD group scope. As another example, a threadgroup private memory space may have a tile scope. Additional examples of private spaces include interface, shader core, local image block, and execution state types. Dynamically allocating memory for these structures may provide efficient allocations relative to fixed buffers, for example. Different types of spaces may have different numbers of virtual IDs that are allowed to request space (these IDs may be mapped to hardware IDs of requesting circuitry) and different maximum sizes per virtual ID.

Disclosed techniques may advantageously allow device-memory backing of private memory space, provide flexibility in allocating private memory storage for different purposes, provide quick translations, allow determinations whether sufficient virtual pages are available for a given task, reduce software memory footprints, and provide memory access patterns that are desirable from a caching standpoint. Flexibility in allocation, in particular, may include the ability to dynamically adjust the amount of memory allocated for different types of private memory (e.g., general-purpose registers in thread-private memory or local memory space in threadgroup-private memory) rather than using fixed buffers for those purposes. Further, disclosed on-demand techniques may reduce the time that memory is allocated (e.g., relative to allocating memory in advance) which may reduce overall memory use.

Figure 2:
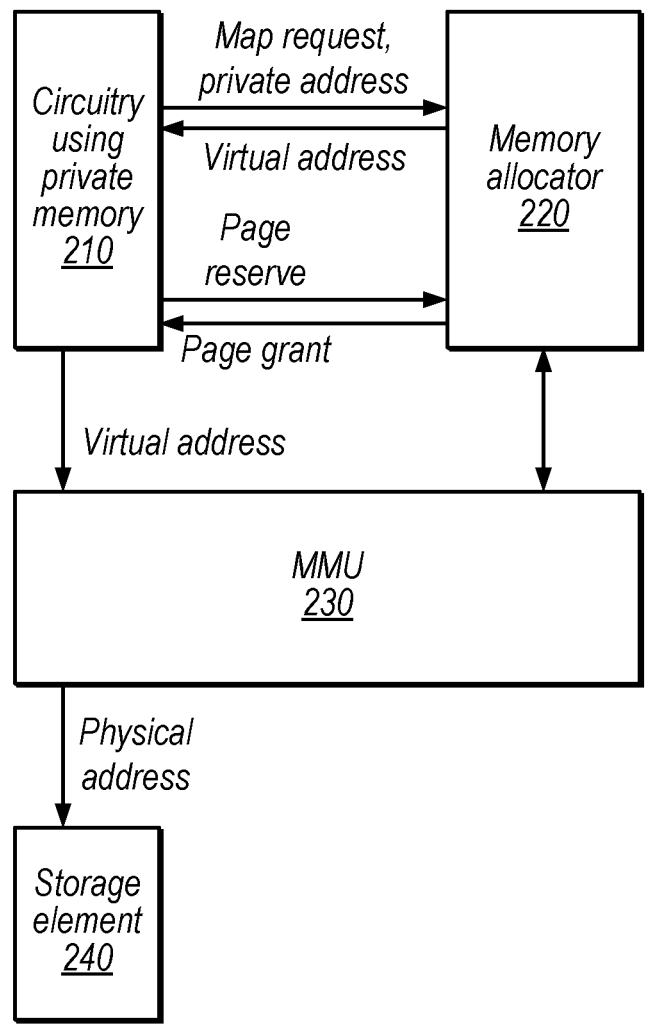
FIG. 2 is a block diagram illustrating an example device with private memory allocator circuitry, according to some embodiments.

FIG. 2 is a block diagram illustrating an example private memory allocator, according to some embodiments. In the illustrated embodiment, the system includes circuitry 210, memory allocator 220, memory management unit 230, and storage element 240.

Circuitry 210, in the illustrated embodiment, uses a private memory space that is dynamically allocated. A programmable shader 160 is one example of circuitry 210. In the illustrated embodiment, circuitry 210 is configured to send page reserve requests to memory allocator 220 and receive page grants. Note that the reservation may not actually map a page, but may decrement a counter to reserve a page for circuitry 210. Circuitry 210 is also configured to send map requests to memory allocator 220 with a private address and receive a corresponding virtual address based on dynamic mapping of a page for the private address. Circuitry 210 then uses the virtual address to access storage element 240 via MMU 230.

Memory allocator 220, in the illustrated embodiment, is configured to receive and respond to requests from circuitry 210 as described above. Memory allocator 220 communicates with MMU 230, e.g., to access page pool information stored in global memory space (e.g., which may be implemented by storage element 240, which may be part of a cache/memory hierarchy). Memory allocator 220 may determine whether elements of a page table hierarchy exist for a given request and dynamically create structures that are not present. Memory allocator 220 or circuitry 210 may include various caching circuitry for caching page table information at one or more hierarchical levels.

MMU 230, in some embodiments, is configured to translate virtual addresses in a global memory space to physical addresses in storage element 240. In some embodiments, MMU 230 is not involved in private memory allocation and therefore may implement any of various appropriate traditional architectures. Note that MMU 230 may implement a paging scheme for translating virtual addresses to physical addresses, which may be separate from the paging techniques discussed herein for translating private addresses to virtual addresses. In some embodiments, the page table for MMU 230 is all memory backed based on a known memory size, while the page tables used by memory allocator 220 may dynamically grow and shrink.

Storage element 240, in the illustrated embodiment, is accessed via physical addresses and may be implemented using any of various appropriate memory technologies. Note that various data cache levels in a cache/memory hierarchy may be accessed using virtual or physical addresses. Thus, if requested data is already cached in a cache tagged using virtual address data, MMU 230 may not be involved processing the requested data. Further, storage element 240 may be a data cache that is tagged using physical address, a random access memory, or a hard drive, for example.

Example Memory Allocator

Figure 3:
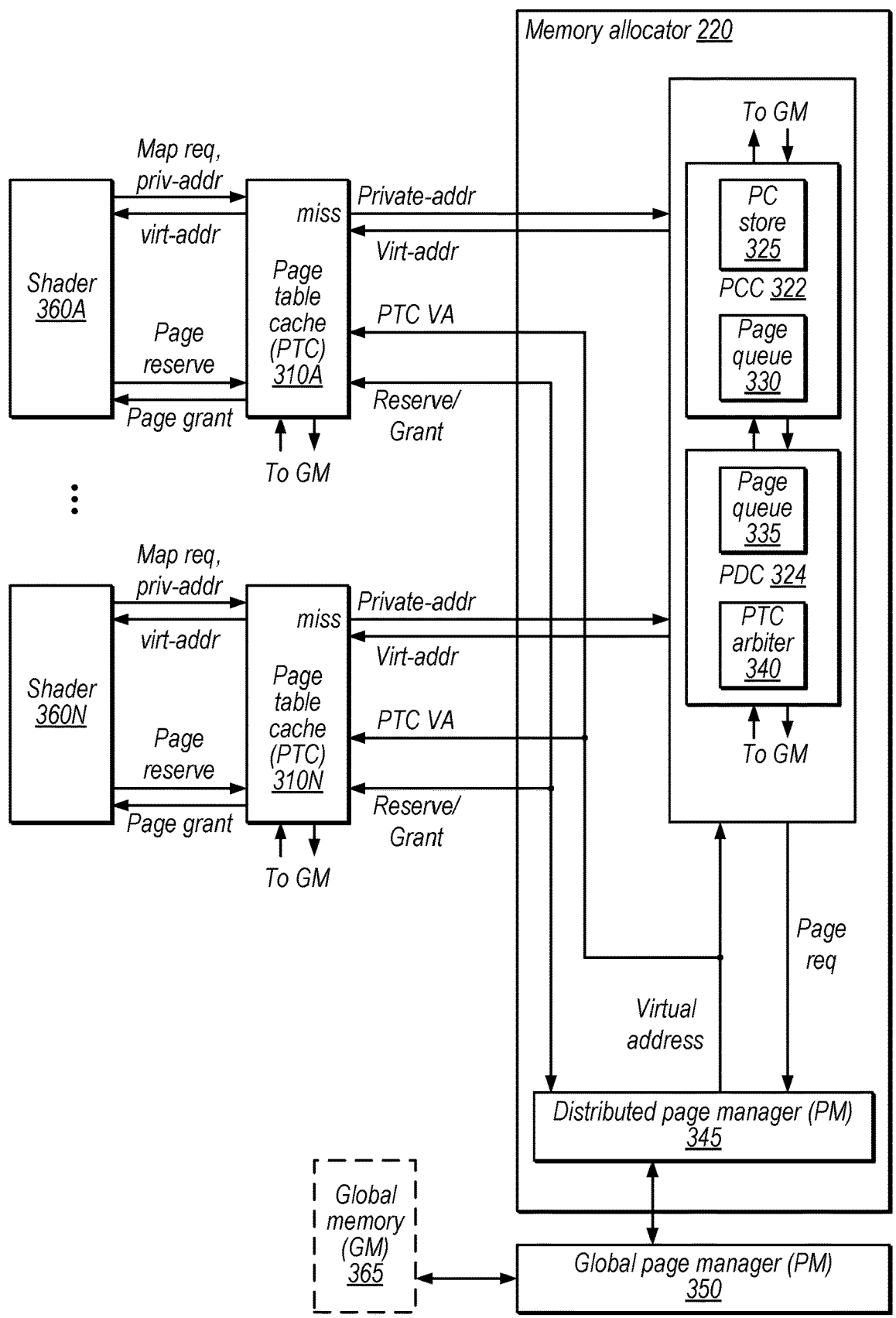
FIG. 3 is block diagram illustrating a more detailed system with memory allocator circuitry and caches for page table information, according to some embodiments.

FIG. 3 is a block diagram illustrating a detailed example memory allocator, according to some embodiments. In the illustrated embodiment, the system includes shaders 360A-360N, page table caches (PTCs) 310A-310N, memory allocator 220, global page manager (PM) 350, and global memory (GM) 365. Memory allocator 220, includes page catalog cache (PCC) 322 (which includes page queue 330 and page catalog (PC) store 325) and page directory cache (PDC) 324 (which includes page queue 335 and PTC arbiter 340. The illustrated example provides caching of page table information to improve performance of dynamic allocation of private memory for shaders 360.

Shaders 360 are one example of circuitry 210 and may be configured to execute shader programs, which are typically single-instruction multiple-data (SIMD) programs. Shaders 360 may execute various types of work that may use private memory, including pixel shading tasks, vertex processing, or general compute tasks. As shown, a shader 360 may initiate map requests with a private address and receive a virtual address mapped to the private address. Shaders 360 may then provide virtual addresses to a cache/memory hierarchy, which may translate the virtual address in global memory space to a physical address in a storage element, if needed. As shown, a shader 360 may also send a page reserve request and receive a page grant (if there are sufficient pages in the page pool).

PTCs 310, in some embodiments, are configured to cache page table entries. Note that an example hierarchical page table structure that includes page table, page directory, and page catalog entries is discussed in detail below with reference to FIG. 4. In some embodiments, each PTC entry includes multiple (e.g., 2, 4, 8, etc.) private to virtual translations. PTCs 310 may implement a least-recently-used (LRU) replacement policy. PTCs 310 may implement various set/way implementations and buffer depths (e.g., for storing received requests or received page table information) and these parameters may be configurable. The tag for each entry may be a portion of a hash of the private address. Each entry may also include a field indicating the number of outstanding requests for the entry (and entries are replaced only when this count is zero, in some embodiments).

For page reservations, a PTC 310 may communicate with distributed page manager 345, which may in turn communicate with global page manager 350 to determine whether sufficient pages are available and decrement the page count if granting a request. If a page table entry corresponding to the private address is present in a PTC 310, it is configured to provide the specified virtual address from the entry. If a requested page table entry is not present in a PTC 310 (a cache miss), it sends the private address to memory allocator 220 and receives a mapped virtual address (in some embodiments, memory allocator 220 may provide multiple virtual addresses, e.g., that share the same mask bit, for caching). In the illustrated embodiment, memory allocator 220 is also configured to provide a virtual address of a page table page to a PTC 310. Each PTC 310 may include a page queue (not shown) configured to queue received page information and page queues 330 and 335 for PCC 322 and PDC 324 may operate in a similar manner for their respective caches.

In some embodiments, PTC entries include a page table base, which may avoid a need to request this information from a higher-level cache on evictions. In some embodiments, the caches described herein include one or more additional buffers or FIFOs, including for example, a hit FIFO, latency FIFO/buffer, and write buffer for communication between tag check circuitry and data cache circuitry. Thus, in some embodiments, requests may be returned out-of-order. Various features of the PTC may be similarly implemented for PCC 322 or PDC 324.

PDC 324, in some embodiments, is configured to cache page directory entries. PTC arbiter 340 may arbitrate among multiple page table caches to select request(s) allowed to access PDC 324 in a given cycle. PTCs may access the PDC when they have a cache miss. PCC 322, in some embodiments, is configured to cache page catalog entries. PDC 324 may access PCC when it has a cache miss.

Distributed page manager 345, in some embodiments, is configured to communicate with global page manager 345 to reserve pages from a page pool and free pages after they are no longer use. In some embodiments, global page manager 350 is configured to communicate with multiple distributed page mangers. In some embodiments, global page manager 350 is configured to generate an interrupt if a counter tracking the number of pages in the page pool is too low, and the device may take a corrective action based on the interrupt.

Global memory (GM) 365 is a global memory space accessible via virtual addresses. In some embodiments, memory for a computing device is consolidated in global memory 365, such that various private or shared memory spaces are backed in global memory 365. Note that the device may use a memory hierarchy with one or more data cache levels and a backing storage element to implement the global memory space. In some embodiments, disclosed techniques may provide efficient cache access patterns in a data cache hierarchy.

Various elements of FIG. 3 may support out-of-order returns of requested information, which may provide low latency, in various embodiments. In some embodiments, portions of the page pool may be reserved for specific types of work, e.g., to allow producer-consumer relationships and protect a portion of the pool for consumer-type work. In some embodiments, the device is configured to allow software-adjustment of the size of the page pool. In some embodiments, a driver allocates space in memory for a ring buffer of pages and populates addresses associated with those pages. A page pool descriptor table may describe the layout of each page pool accessible to software. In some embodiments, this may allow developers to create different page pools for different applications, contexts, channels, etc.

In some embodiments, the graphics processor includes coherency circuitry configured to maintain at least partial coherency for page tables across a programmable shader. The coherency circuitry may also maintain at least partial coherency for page tables across multiple programmable shader processors that are included in the same GPU. This may allow private memory allocations to migrate from one shader processor to another. Further, the coherency circuitry may allow GPU-scoped private memory allocation.

Example Page Table Hierarchy

Figure 4:
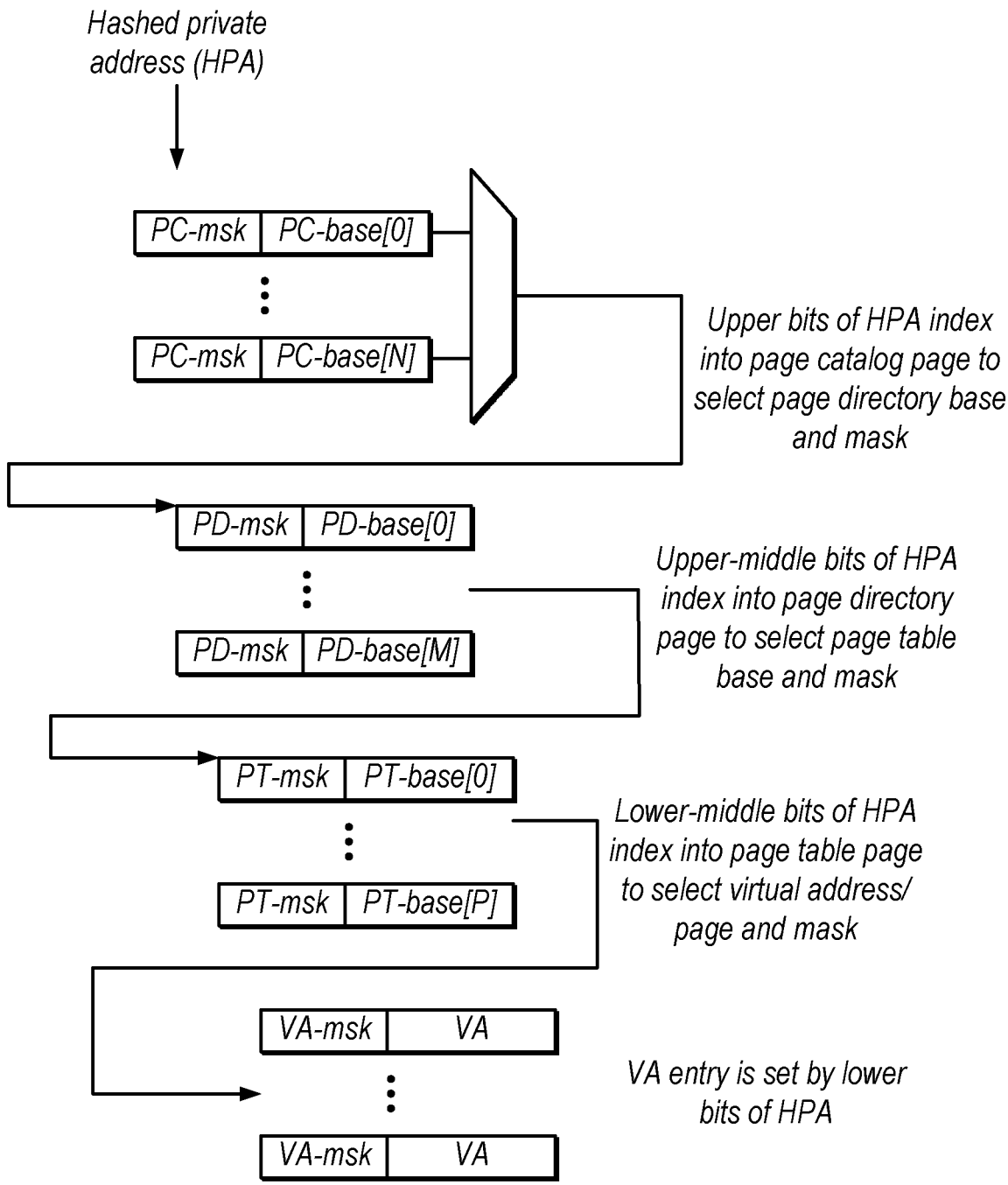
FIG. 4 is a diagram illustrating an example page table hierarchy, according to some embodiments.

FIG. 4 is a diagram illustrating an example page table hierarchy, according to some embodiments. Note that this page table hierarchy for translations from private memory space to a virtual memory space (e.g., global memory) may be separate from a page table used by an MMU to translate virtual addresses to physical addresses. The two page table hierarchies may be similarly structured, however, in some embodiments.

In the illustrated embodiment, the device is configured to generate a hashed private address (HPA) by performing a hash function on a provided private address. The hashing may map a certain number of IDs to the same page table pages. This may allow adjacent SIMD groups of shader programs to share a page table page, for example. In some embodiments, different bit fields of the hashed private address are used to access different levels in the page table hierarchy, as shown in FIG. 4. Note that the private addresses may be processed before hashing, e.g., to re-arrange fields, convert hardware IDs to virtual IDs, etc. Hardware IDs may be used to track finite hardware resources and allow the device to track work in flight. Virtual IDs may allow preemption of thread groups, for example, where a set of work is switched out and another set of work takes over the same hardware resources. In some embodiments, PTCs are responsible for writing out data structures with tokens for preempted kernels and thread groups along with corresponding virtual IDs when a corresponding thread group is preempted.

In the illustrated example, the upper bits of the HPA are used to index into the page catalog page to select a page directory base and mask. As shown, each page catalog entry includes a page catalog mask and page catalog base. The base points to a page directory address. The mask bits may each indicate, for a certain number of consecutive page directory entries (e.g., 1, 2, 4, 8, etc.) in a page directory page, whether any of those entries are valid. Memory allocator 220 may use the masks to determine when to invalidate and free pages, e.g., after unmap requests cause all of their mask bits to be cleared. Thus, in various embodiments, the mask may advantageously allow dynamic teardown of the page table hierarchy when it is no longer needed. Although bit masks are discussed herein for the purpose of explanation, various encodings may be used in other embodiments. For example, a count field may count the number of valid entries in a portion of the next-lowest level in the hierarchy.

In the illustrated example, the multiplexer is controlled based on upper bits of the HPA. The page catalog may include a set of entries for each kick slot, where a kick is a unit of work to be processed by the graphics unit. Note that entries at various levels in the hierarchy may include a valid field (e.g., a bit), although the valid fields are not shown for purposes of illustration.

In the illustrated example, the upper-middle bits of the HPA are used to index into the page directory page indicated by the selected PC-base. As shown, each page directory entry includes a page directory mask and page directory base. The mask may be used similarly to the PC mask described above. The mask bits indicates, for a certain number of consecutive page table entries in a page table page, whether any of those entries are valid. The base points to a page table address.

In the illustrated example, the lower-middle bits of the HPA are used to index into the page table page indicated by the selected PD-base. As shown, each page table entry includes a page table mask and page table base. The base points to a virtual page. The mask bits indicate, for a certain number of consecutive virtual address entries in a virtual page, whether any of those entries are valid.

In the illustrated example, the lower bits of the HPA are used to index into the virtual page to access a virtual address mask and virtual address for the private address. The VA mask field may track whether sectors have been written to memory or not, and its bits may function as modified/dirty indications for those sectors. For translate-no-map requests where the VA mask bit is clean, data for a read request may not need to be returned from memory.

Example Setup of Page Hierarchy

Figure 5:
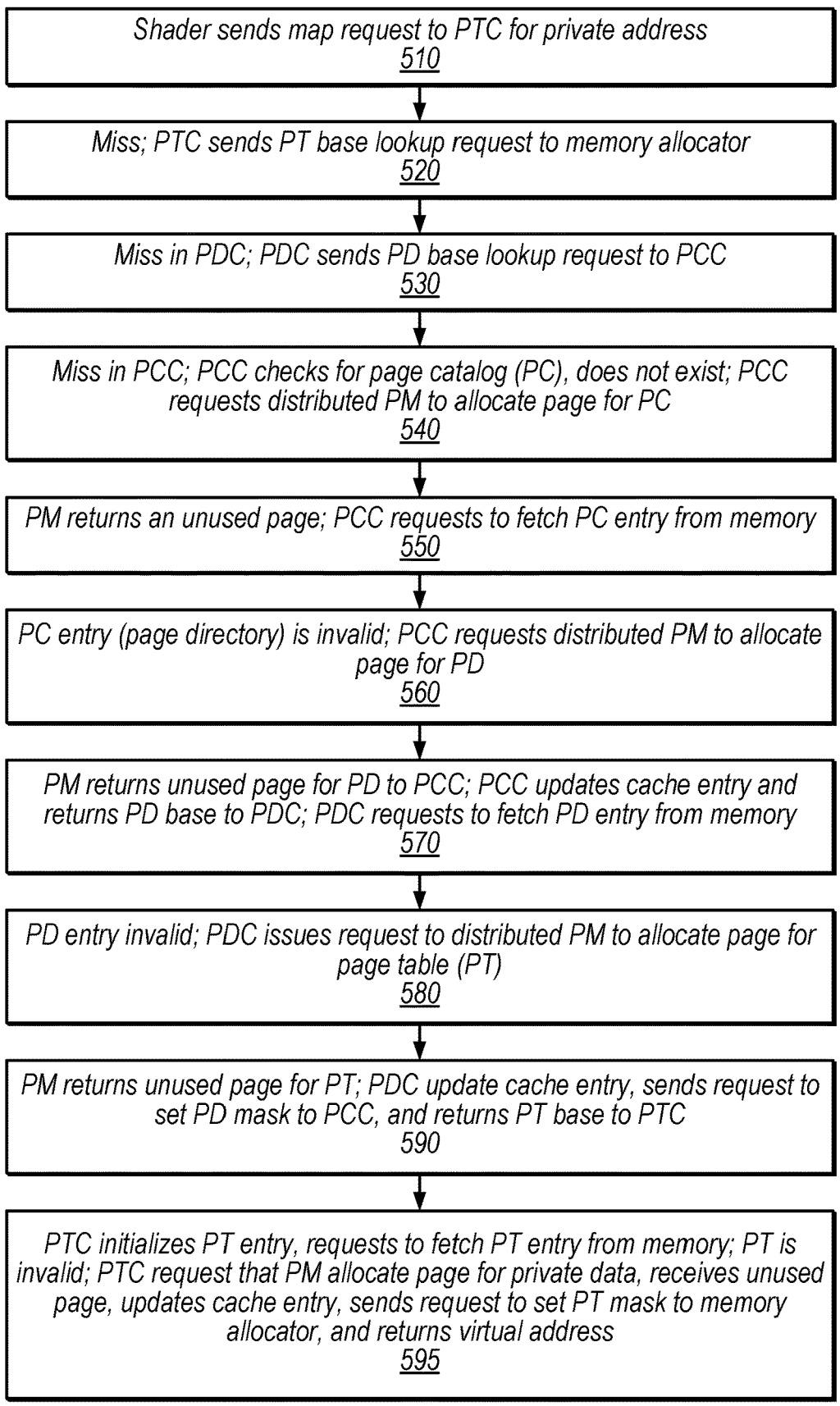
FIG. 5 is a flow diagram illustrating an example method for creating page table entries and mapping a page and in response to a request, according to some embodiments.

FIG. 5 is a flow diagram illustrating an example technique for mapping a private address to a virtual address when the page table is not setup, according to some embodiments. In some embodiments, various elements of FIG. 5 may be omitted when page table information is already cached or allocated; FIG. 5 provides an example where no page table, page directory, or page catalog entries for the mapping are initially valid.

At 510, in the illustrated embodiment, a shader 360 sends a map request (e.g., a translate-map request) to a PTC 310 and the request includes a private address in a private memory space.

At 520, in the illustrated embodiment, the PTC 310 determines that a miss has occurred, e.g., because it does not include an entry whose tag matches the private address. The PTC then sends a page table base lookup request to memory allocator 220. The memory allocator 220 arbitrates among PTC requests and processes the lookup request at the PDC 324 when the request wins arbitration.

At 530, in the illustrated embodiment, the private address misses in the PDC, which sends a page directory base lookup request to the PCC 322.

At 540, in the illustrated embodiment, the private address misses in the PCC, which checks for a page catalog (PC) for the request. This check may utilize on-chip pointers to determine that a PC does not exist. In the illustrated example, the PCC requests the distributed page manager 345 to allocate a page for the page catalog.

At 550, in the illustrated embodiment, the distributed page manager returns an unused page and the PCC requests to fetch the program catalog entry from memory (e.g., reading from an offset that is based on the PC base and a portion of the private address). The PCC may update on-chip pointers to point to the PC base.

At 560, in the illustrated embodiment, the PC returned entry (page directory) is invalid, so the PCC requests the page manager to allocate a page for the page directory.

At 570, in the illustrated embodiment, the distributed page manager 345 returns an unused page for the page directory to the PCC, which updates the cache entry and returns the page directory base to the page directory cache. The PDC requests to fetch the page directory entry from memory.

At 580, in the illustrated embodiment, the returned page directory entry (page table) is invalid, so the PDC issues a request to the distributed page manager to allocate a page for the page table.

At 590, in the illustrated embodiment, the distributed page manager 345 returns an unused page for the page table and the PDC updates the cache entry. The PDC also sends a request to set the page directory mask to the PCC and returns the page table base to the PTC.

At 595, in the illustrated embodiment, the PTC initializes the page table entry and requests to fetch the page table entry from memory. The page table is invalid, so the PTC requests that the distributed page manger 345 allocate a page for private data. The page manager 345 provides an unused page. The PTC updates the cache entry, sends a request to set the page table mask to memory allocator 220 (which may arbitrate among multiple requests), and returns a virtual address corresponding to the updated PTC entry to the shader 360.

In this example, the device dynamically sets up the entire part of the page table hierarchy needed to map the private address to a virtual address, including properly adjusting the corresponding masks to reflect the setup. If parts of the hierarchy have already been generated, various elements of FIG. 5 may be skipped and the existing information may be utilized.

Example Method

Figure 6:
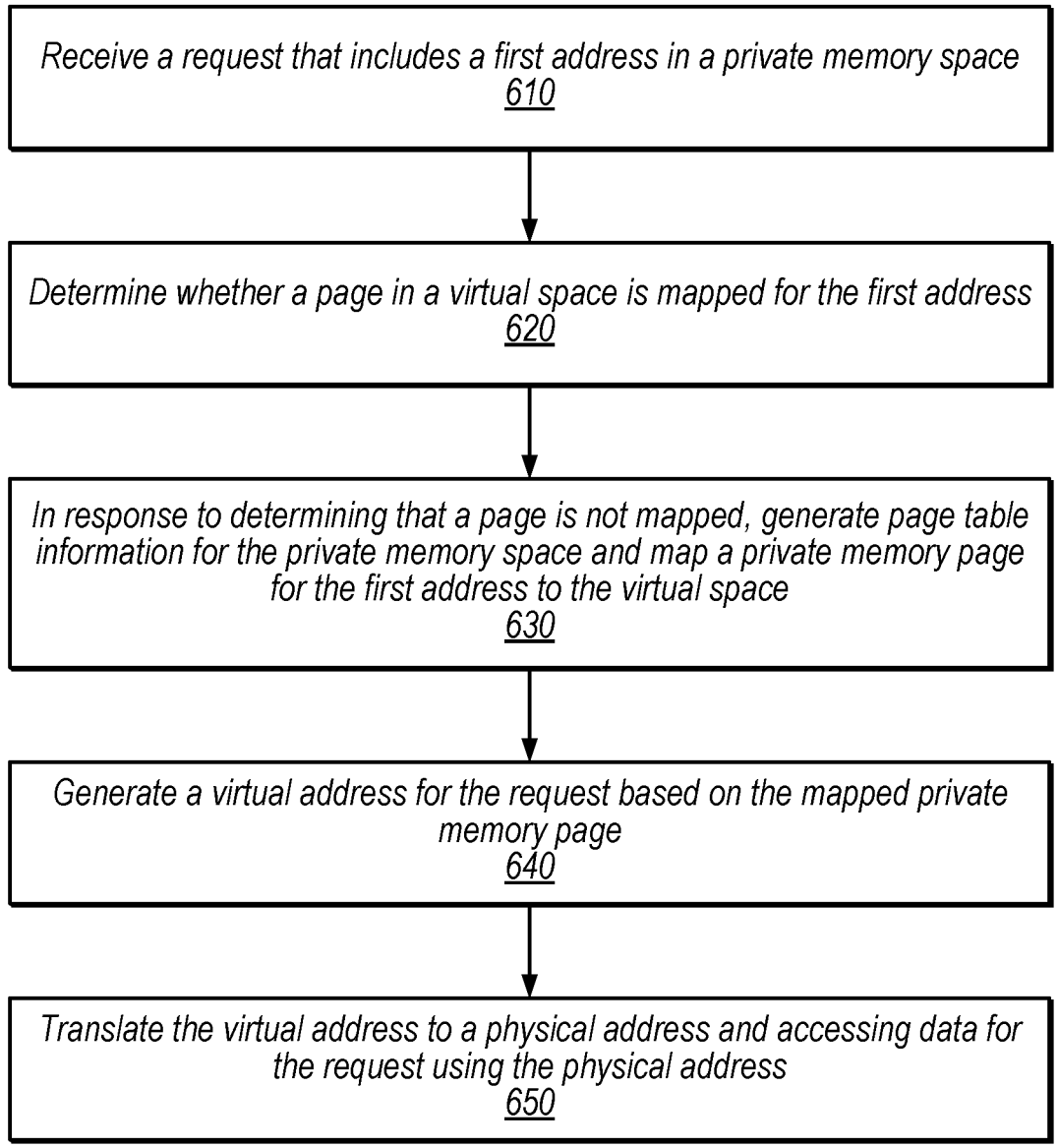
FIG. 6 is a flow diagram illustrating a more general method for handling an access requests that includes an address in a private memory space, according to some embodiments.

FIG. 6 is a flow diagram illustrating an example method for handling an access request that include a private address, according to some embodiments. The method shown in FIG. 6 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 610, in the illustrated embodiment, private memory allocation circuitry (e.g., circuitry 220) receives a request that includes a first address in a private memory space. The request may be a translate-map request, for example.

At 620, in the illustrated embodiment, the private memory allocation circuitry determines whether a page in a virtual space is mapped for the first address. In some embodiments, this may include checking caches for multiple levels of the page table hierarchy to determine whether a page is mapped. In some embodiments, first cache circuitry (e.g., a PTC 310) is configured to cache page table entries corresponding to requests from the first circuitry. In some embodiments, second cache circuitry (e.g., PDC 324 or PCC 322) is configured to cache, for multiple different requesting circuits, page table information at one or more non-lowest levels of a page table hierarchy.

At 630, in the illustrated embodiment, in response to determining that a page is not mapped, the private memory allocation circuitry generates page table information for the private memory space and maps a private memory page for the first address to the virtual space. This may include generating page catalog, page directory, and page table entries for the private memory page, for example. In some embodiments, the page table information includes multiple hierarchical levels and the apparatus is configured to maintain tracking information at each level (e.g., the mask fields of FIG. 4) indicating whether entries at lower levels are valid. In some embodiments, the apparatus is configured to free a page of the page table hierarchy in response to one or more unmap requests causing tracking information to indicate that the page does not have any corresponding valid entries At 640, in the illustrated embodiment, the system generates a virtual address for the request based on the mapped private memory page. The private memory allocation circuitry may provide the virtual address back to the requesting circuitry. In some embodiments, to generate a virtual address for the request based on the mapped private memory page, the private memory allocation circuitry is configured to generate a hash of the first address and access multiple levels of a page table hierarchy based on portions of the hash result.

At 650, in the illustrated embodiment, the system translates the virtual address to a physical address and accesses data for the request using the physical address. the apparatus is configured to access a first page table hierarchy (e.g., the hierarchy of FIG. 4) to translate the first address to the virtual address and access a second page table hierarchy (e.g., a traditional page table hierarchy) to translate the virtual address to the physical address.

In some embodiments, the apparatus is configured to maintain a count of available pages, e.g., in a page pool, and the private memory allocation circuitry is configured to decrement the count and provide a grant response to a page reservation request. In some embodiments, the private memory allocation circuitry includes multiple distributed units that are each dedicated to a set of shader processors and a global unit configured to communicate with the distributed units to manage page requests.

In some embodiments, the private memory allocation circuitry is configured to unmap a virtual page from a private memory page in response to an unmap request. In some embodiments, the private memory allocation circuitry is configured to process a translate-no-map request that specifies to translate a private address to a virtual address if a corresponding private memory page is mapped to a virtual address for the private address, but not to map a private virtual page for the address otherwise.

Example Device

Figure 7:
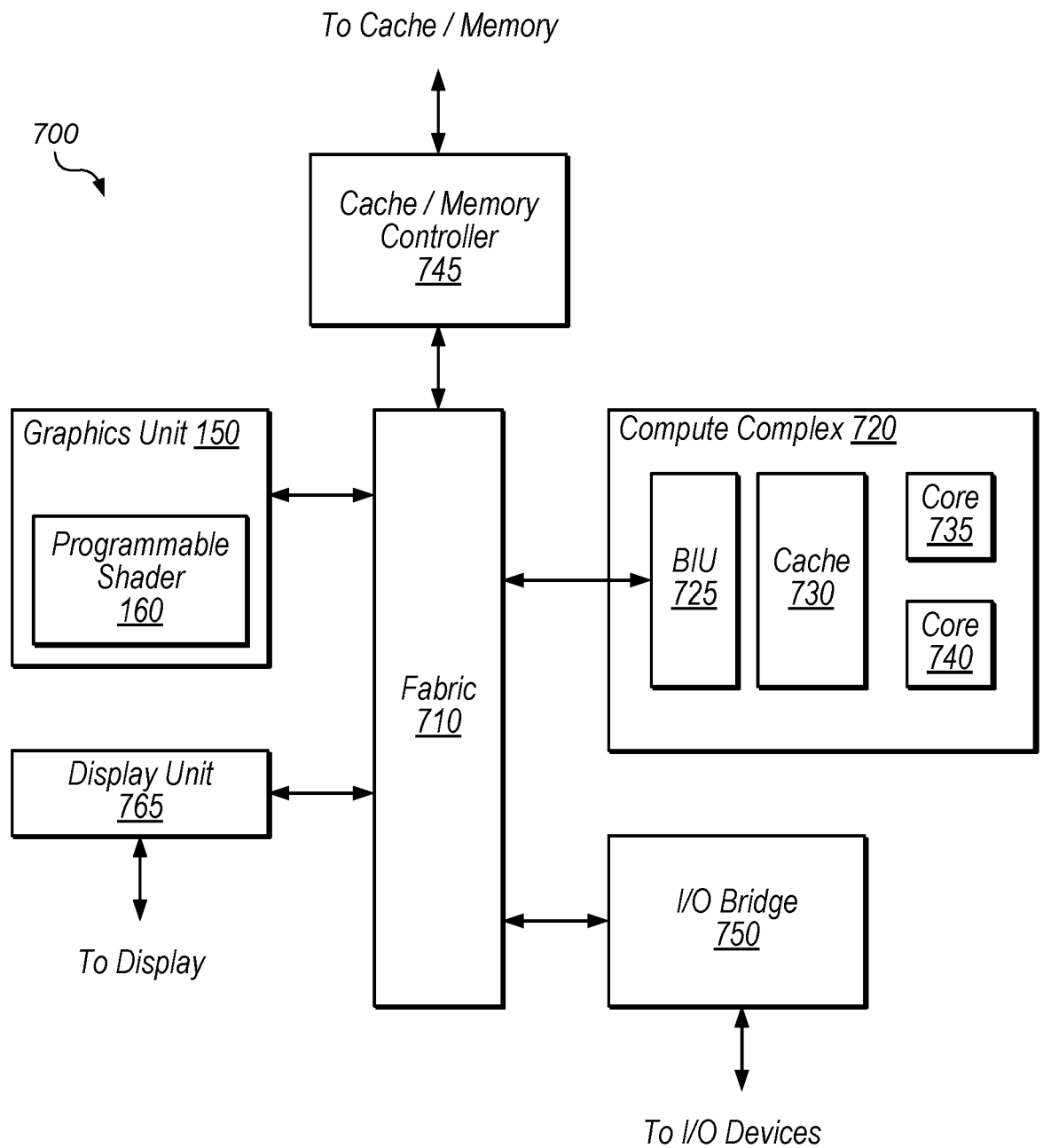
FIG. 7 is a block diagram illustrating an example computing device, according to some embodiments.

Referring now to FIG. 7, a block diagram illustrating an example embodiment of a device 700 is shown. In some embodiments, elements of device 700 may be included within a system on a chip. In some embodiments, device 700 may be included in a mobile device, which may be battery-powered. Therefore, power consumption by device 700 may be an important design consideration. In the illustrated embodiment, device 700 includes fabric 710, compute complex 720, input/output (I/O) bridge 750, cache/memory controller 745, graphics unit 150, and display unit 765. In some embodiments, device 700 may include other components (not shown) in addition to and/or in place of the illustrated components, such as video processor encoders and decoders, image processing or recognition elements, computer vision elements, etc.

Fabric 710 may include various interconnects, buses, MUX's, controllers, etc., and may be configured to facilitate communication between various elements of device 700. In some embodiments, portions of fabric 710 may be configured to implement various different communication protocols. In other embodiments, fabric 710 may implement a single communication protocol and elements coupled to fabric 710 may convert from the single communication protocol to other communication protocols internally.

In the illustrated embodiment, compute complex 720 includes bus interface unit (BIU) 725, cache 730, and cores 735 and 740. In various embodiments, compute complex 720 may include various numbers of processors, processor cores and/or caches. For example, compute complex 720 may include 1, 2, or 4 processor cores, or any other suitable number. In one embodiment, cache 730 is a set associative L2 cache. In some embodiments, cores 735 and/or 740 may include internal instruction and/or data caches. In some embodiments, a coherency unit (not shown) in fabric 710, cache 730, or elsewhere in device 700 may be configured to maintain coherency between various caches of device 700. BIU 725 may be configured to manage communication between compute complex 720 and other elements of device 700. Processor cores such as cores 735 and 740 may be configured to execute instructions of a particular instruction set architecture (ISA) which may include operating system instructions and user application instructions.

Cache/memory controller 745 may be configured to manage transfer of data between fabric 710 and one or more caches and/or memories. For example, cache/memory controller 745 may be coupled to an L3 cache, which may in turn be coupled to a system memory. In other embodiments, cache/memory controller 745 may be directly coupled to a memory. In some embodiments, cache/memory controller 745 may include one or more internal caches.

As used herein, the term "coupled to" may indicate one or more connections between elements, and a coupling may include intervening elements. For example, in FIG. 7, graphics unit 150 may be described as "coupled to" a memory through fabric 710 and cache/memory controller 745. In contrast, in the illustrated embodiment of FIG. 7, graphics unit 150 is "directly coupled" to fabric 710 because there are no intervening elements.

Graphics unit 150 may include one or more processors and/or one or more graphics processing units (GPU's). Graphics unit 150 may receive graphics-oriented instructions, such as OPENGL®, Metal, or DIRECT3D® instructions, for example. Graphics unit 150 may execute specialized GPU instructions or perform other operations based on the received graphics-oriented instructions. Graphics unit 150 may generally be configured to process large blocks of data in parallel and may build images in a frame buffer for output to a display. Graphics unit 150 may include transform, lighting, triangle, and/or rendering engines in one or more graphics processing pipelines. Graphics unit 150 may output pixel information for display images. Programmable shader 160, in various embodiments, may include highly parallel execution cores configured to execute graphics programs, which may include pixel tasks, vertex tasks, and compute tasks (which may or may not be graphics-related).

In some embodiments, graphics unit 150 includes the memory allocator circuitry, shader circuitry, MMU, etc. discussed herein.

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display).

I/O bridge 750 may include various elements configured to implement: universal serial bus (USB) communications, security, audio, and/or low-power always-on functionality, for example. I/O bridge 750 may also include interfaces such as pulse-width modulation (PWM), general-purpose input/output (GPIO), serial peripheral interface (SPI), and/or inter-integrated circuit (I2C), for example. Various types of peripherals and devices may be coupled to device 700 via I/O bridge 750.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 8:
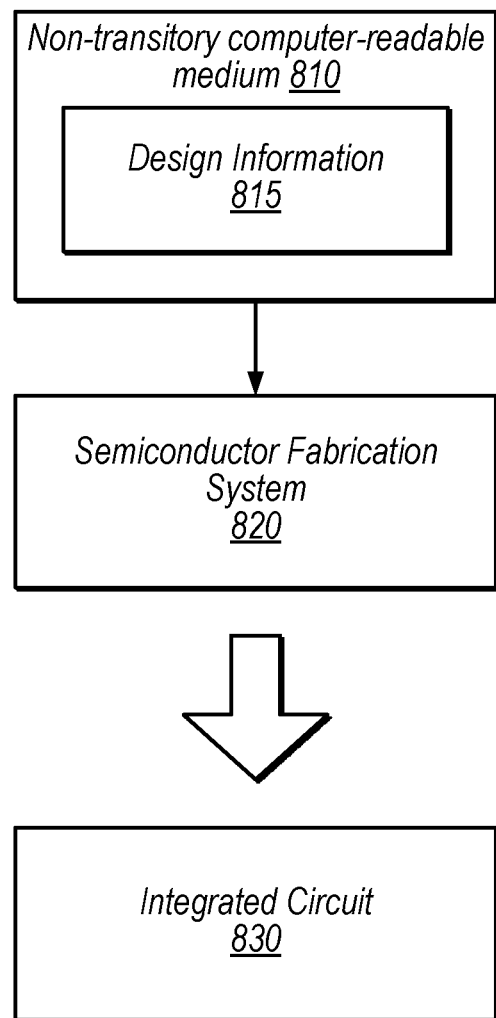
FIG. 8 is a block diagram illustrating an example computer-readable medium that stores circuit design information, according to some embodiments.

FIG. 8 is a block diagram illustrating an example non-transitory computer-readable storage medium that stores circuit design information, according to some embodiments. In the illustrated embodiment semiconductor fabrication system 820 is configured to process the design information 815 stored on non-transitory computer-readable medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system 820. In some embodiments, design information 815 may also include one or more cell libraries which specify the synthesis and/or layout of integrated circuit 830. In some embodiments, the design information is specified in whole or in part in the form of a netlist that specifies cell library elements and their connectivity. Design information 815, taken alone, may or may not include sufficient information for fabrication of a corresponding integrated circuit. For example, design information 815 may specify the circuit elements to be fabricated but not their physical layout. In this case, design information 815 may need to be combined with layout information to actually fabricate the specified circuitry.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown in FIG. 1B, 2, 3, or 7. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
   receiving, by private memory allocation circuitry, a request that includes a first address in a private memory space;
   determining, by the private memory allocation circuitry, whether a page in a virtual space is mapped for the first address;
   in response to determining that a page is not mapped, the private memory allocation circuitry generating page table information for the private memory space and mapping a private memory page for the first address to the virtual space;
   generating a virtual address for the request based on the mapped private memory page; and
   translating the virtual address to a physical address and accessing data for the request using the physical address.

2. The method of claim 1, further comprising:
   caching, by first cache circuitry, page table entries corresponding to requests from circuitry that issued the request; and
   caching, by second cache circuitry, page directory and page catalog information.

3. The method of claim 1, wherein the generating the virtual address includes accessing a first page table hierarchy to translate the first address to the virtual address and wherein the translating the virtual address to a physical address includes accessing a second page table hierarchy.

4. An apparatus, comprising:
first circuitry configured to request to access a private memory space using a first address;
private memory allocation circuitry configured to:
determine whether a page in a virtual space is mapped for the first address;
in response to determining that a page is not mapped, generate page table information for the private memory space and map a private memory page for the first address to the virtual space; and
generate a virtual address for the request based on the mapped private memory page; and
memory management unit (MMU) circuitry configured to translate the virtual address to a physical address in a storage element of the apparatus.

5. The apparatus of claim 4, further comprising:
first cache circuitry configured to cache page table entries corresponding to requests from the first circuitry.

6. The apparatus of claim 5, wherein the private memory allocation circuitry includes:
second cache circuitry configured to cache, for multiple different requesting circuits, page table information at one or more non-lowest levels of a page table hierarchy.

7. The apparatus of claim 6, wherein the second cache circuitry includes a page directory cache and a page catalog cache.

8. The apparatus of claim 4, wherein the apparatus is configured to maintain a count of available pages; and
wherein, in response to a page reserve request, the private memory allocation circuitry is configured to decrement the count and provide a page grant response.

9. The apparatus of claim 4, wherein the private memory allocation circuitry includes multiple distributed units that are each dedicated to a set of shader processors and a global unit configured to communicate with the distributed units to manage page requests.

10. The apparatus of claim 4, wherein the private memory allocation circuitry is further configured to:
process a translate-no-map request that specifies to translate a private address to a virtual address if a corresponding private memory page is mapped to a virtual address for the private address, but not to map a private virtual page for the address otherwise.

11. The apparatus of claim 4, wherein the private memory allocation circuitry is further configured to:
unmap a virtual page from a private memory page in response to an unmap request.

12. The apparatus of claim 4, wherein, to generate a virtual address for the request based on the mapped private memory page, the private memory allocation circuitry is configured to generate a hash of the first address and access multiple levels of a page table hierarchy based on portions of the hash result.

13. The apparatus of claim 4, wherein the page table information includes multiple hierarchical levels, wherein the apparatus is configured to maintain tracking information at each level indicating whether entries at lower levels are valid, and wherein the apparatus is configured to free a page of the page table hierarchy in response to one or more unmap requests causing tracking information to indicate that the page does not have any corresponding valid entries.

14. The apparatus of claim 4, wherein the apparatus is configured to access a first page table hierarchy to translate the first address to the virtual address and access a second page table hierarchy to translate the virtual address to the physical address.

* * * * *